United States Patent
Yoon et al.

(10) Patent No.: US 9,293,613 B2
(45) Date of Patent: Mar. 22, 2016

(54) METHOD FOR PREPARING CIS COMPOUNDS AND THIN LAYER, AND SOLAR CELL HAVING CIS COMPOUND THIN LAYER

(75) Inventors: Seok-Hyun Yoon, Daejeon (KR); Kyoung-Soo Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 1175 days.

(21) Appl. No.: 12/309,531

(22) PCT Filed: Jul. 23, 2007

(86) PCT No.: PCT/KR2007/003536
§ 371 (c)(1),
(2), (4) Date: Jan. 22, 2009

(87) PCT Pub. No.: WO2008/013383
PCT Pub. Date: Jan. 31, 2008

(65) Prior Publication Data
US 2009/0242033 A1    Oct. 1, 2009

(30) Foreign Application Priority Data

Jul. 24, 2006 (KR) .................. 10-2006-0068814

(51) Int. Cl.
*H01L 31/032* (2006.01)

(52) U.S. Cl.
CPC ........... *H01L 31/0322* (2013.01); *Y02E 10/541* (2013.01)

(58) Field of Classification Search
CPC . H01L 31/00; H01L 31/0248; H01L 31/0256; H01L 31/0322; H01L 31/18; H01L 31/186; H01L 31/1876; H01L 21/02365; H01L 31/02; H01L 31/1864; H01L 31/1844; H01L 31/0749; H01L 31/03923
USPC ........ 136/243–265; 427/74, 76, 372.2, 383.1, 427/383.3
See application file for complete search history.

(56) References Cited

U.S. PATENT DOCUMENTS

| | | | |
|---|---|---|---|
| 5,626,688 | A | 5/1997 | Probst et al. |
| 6,127,202 | A | 10/2000 | Kapur et al. |
| 6,268,014 | B1 | 7/2001 | Eberspacher et al. |
| 6,368,892 | B1 | 4/2002 | Arya |
| 6,825,409 | B2 | 11/2004 | Haussler et al. |
| 6,974,976 | B2 | 12/2005 | Hollars |

(Continued)

FOREIGN PATENT DOCUMENTS

| | | |
|---|---|---|
| JP | 10-341029 | 12/1998 |
| JP | 2001-053314 | 2/2001 |
| WO | WO 2005/106082 A1 | 11/2005 |

*Primary Examiner* — Christina Chern
(74) *Attorney, Agent, or Firm* — Dentons US LLP

(57) ABSTRACT

A method for preparing a CIS (Cu—In—Se) compound includes (S1) producing a plurality of first composite particles having an indium selenide outer layer physically coupled to at least a part of a copper selenide seed particle surface or a plurality of second composite particles having a copper selenide outer layer physically coupled to at least a part of an indium selenide seed particle surface; and (S2) making a CIS compound by thermally treating composite particles selected from the group consisting of the first composite particles, the second composite particles and their mixtures. This method may prevent loss of selenium, which inevitably requires selenium environment, and also improves dispersion, coupling and reaction uniformity for the formation of a CIS compound.

9 Claims, 8 Drawing Sheets

(56) References Cited

U.S. PATENT DOCUMENTS

| | | |
|---|---|---|
| 2004/0118698 A1* | 6/2004 | Lu et al. ................ 205/224 |
| 2005/0183767 A1 | 8/2005 | Yu et al. |
| 2006/0062902 A1 | 3/2006 | Sager et al. |
| 2007/0092648 A1* | 4/2007 | Duren et al. ............ 427/255.31 |
| 2008/0280030 A1* | 11/2008 | Van Duren et al. ............ 427/74 |

\* cited by examiner

METHOD FOR PREPARING CIS COMPOUNDS AND THIN LAYER, AND SOLAR CELL HAVING CIS COMPOUND THIN LAYER

This application claims priority to PCT/KR2007/003536 filed on Jul. 23, 2007 and also Korean Patent Application No. 10-2006-0068814 filed on Jul. 24, 2006, the contents of which are hereby incorporated by reference in their entirety.

BACKGROUND OF THE INVENTION

1. Field of the Invention

The present invention relates to a method for preparing a CIS (Cu—In—Se) compound and a thin film, and a solar cell having the CIS compound thin film.

2. Description of the Related Art

A CIS (Cu—In—Se) compound, representatively $CuInSe_2$, is used for an absorption layer of a solar cell. To make an absorption layer using $CuInSe_2$, there are generally used a method for depositing $CuInSe_2$ on a substrate in a vacuum and a method for coating $CuInSe_2$ precursor in non-vacuum and then thermally treating it at a high temperature. Among them, the vacuum deposition is advantageous in making a high-efficient absorption layer, but it shows deteriorated uniformity when making a large-sized absorption layer and also needs an expensive equipment. Meanwhile, the method of coating precursor materials and then thermally treating them at a high temperature allows one to make a large-sized absorption layer uniformly, but it shows low efficiency of the absorption layer.

Among various absorption layer making methods using precursor materials, a method of coating paste of a metal oxide mixture on a substrate and then thermally treating them to make an absorption layer seems to be most suitable for practical use in mass production. This method may allow one to make uniform absorption layers at a low cost. However, since metal oxide precursor is very stable chemically and thermally, it is difficult to obtain large crystals in a final absorption layer, which results in lowered efficiency.

In addition, Japanese Laid-open Patent Publication No. 2001-053314 discloses a method for forming a thin film by spraying a dispersion solution containing Cu and Se powder and organic metal salt of In on a conductive substrate and then thermally treating it under a non-oxidizing environment, but this method needs more improvement in its productivity.

Also, Japanese Patent No. 3589380 discloses a technique for forming $CuInSe_2$ by soaking a substrate into a solution in which a salt of an element in the 3B group of the periodic table (e.g., $InCl_3$), an organic material containing an element in the 6B group (e.g., $CH_3CSeNH_2$), and an acid (e.g., HCl), but it needs more improvement in use of $CuInSe_2$ itself during reaction and suffers from a generally low reaction yield.

In addition, U.S. Pat. No. 6,127,202 discloses a method for making CIGS (Cu—In—Ga—Se) by reacting a mixture of metal oxide nano particles under reduction environment and selenium gas environment, and U.S. Pat. No. 6,268,014 discloses a method for reacting a mixture of metal oxide and non-oxide particles under reduction environment and selenium environment.

SUMMARY OF THE INVENTION

Inventors of the present invention found that there occurs loss of selenium when making a CIS compound using precursor particles as conventionally, and the conventional CIS compound preparing method using precursor particles does not show excellent dispersion, coupling and reaction uniformity among precursor particles.

Thus, a first object of the present invention is to solve the above problems of the prior art by providing a method for preparing a CIS compound capable of preventing loss of selenium and giving improved dispersion, coupling and reaction uniformity among precursor particles used for formation of a CIS compound.

Also, a second object of the present invention is to provide a method for preparing a CIS compound thin film having the CIS compound according to the present invention.

Also, a third object of the present invention is to provide a composite particle as a precursor used in preparing the CIS compound according to the present invention. Also, a fourth object of the present invention is to provide a solar cell having the CIS compound thin film according to the present invention.

In order to accomplish the above object, the present invention provides a method for preparing a CIS (Cu—In—Se) compound, which includes (S1) producing a plurality of first composite particles having an indium selenide outer layer physically coupled to at least a part of a copper selenide seed particle surface or a plurality of second composite particles having a copper selenide outer layer physically coupled to at least a part of an indium selenide seed particle surface; and (S2) making a CIS compound by thermally treating composite particles selected from the group consisting of the first composite particles, the second composite particles and their mixtures.

According to the preparing method of the present invention, copper selenide and indium selenide acting as reactants for forming a CIS compound exist together in one particle shape, so it is possible to solve problems of dispersion and mixing and to improve reaction uniformity among reactants, resulting in making a large-grained absorption layer uniformly with good efficiency. In addition, by means of rapid reaction among reactants, it is possible to prevent any loss of selenium, which was frequent in the conventional CIS compound preparing work.

An outer layer of the first composite particles and the second composite particles may be formed by adding the seed particles into a precursor solution for outer layer and by reacting them. Specifically, wherein the first composite particles may be formed by adding copper selenide seed particles into a precursor solution for outer layer in which indium nitrate and selenous acid are dissolved in an organic solvent, and then by reacting them. The copper selenide seed particles may be generally formed using at least one selected from the group consisting of CuSe, $Cu_2Se$, and their mixtures, but not limitedly. In addition, the second composite particles may be formed by adding indium selenide seed particles into a precursor solution for outer layer in which copper nitrate and selenous acid are dissolved in an organic solvent, and then by reacting them, but not limitedly.

In another aspect of the present invention, there is also provided a method for preparing a CIS (Cu—In—Se) compound thin film, which includes (S1) producing a plurality of first composite particles having an indium selenide outer layer physically coupled to at least a part of a copper selenide seed particle surface or a plurality of second composite particles having a copper selenide outer layer physically coupled to at least a part of an indium selenide seed particle surface; (S2) coating a paste including the composite particles on a substrate; and (S3) forming a thin film composed of a CIS compound by thermally treating the resultant material of the step (S2).

The paste may be made by mixing the first or second composite particles with ethyl cellulose, polypropylene carbonate or polypropylene glycol acting as a binder in a solvent selected from water, alcohol and glycol, but not limitedly.

In still another aspect of the present invention, there is also provided a composite particle, which includes a copper selenide seed particle; and an indium selenide outer layer physically coupled to at least a part of a surface of the copper selenide seed particle.

In addition, there is also provided a composite particle, which includes an indium selenide seed particle; and a copper selenide outer layer physically coupled to at least a part of a surface of the indium selenide seed particle.

The CIS compound thin film prepared according to the above method may be applied as an absorption layer of a solar cell.

DESCRIPTION OF THE PREFERRED EMBODIMENT

Figure 1:
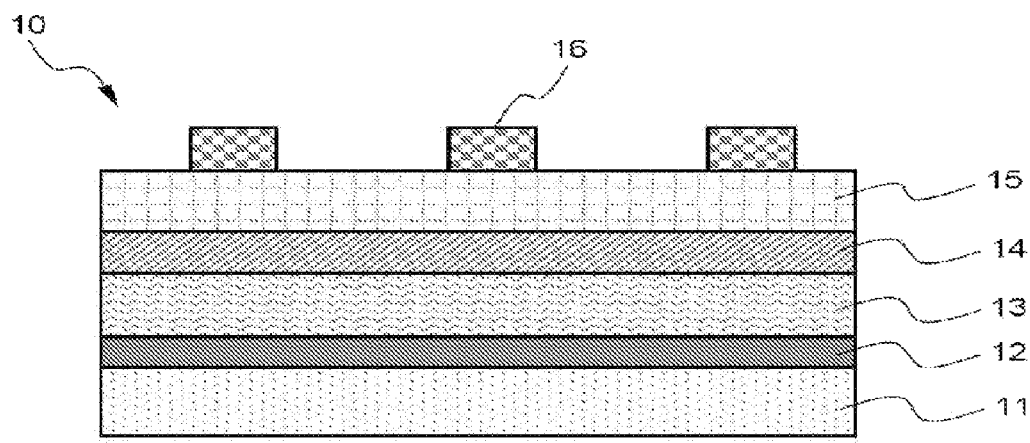
FIG. 1 is a schematic sectional view showing a solar cell to which a solar cell absorption layer is applied according to one embodiment of the present invention.

Hereinafter, the present invention will be explained in detail. Any term or word used in this specification and claims should not be interpreted into a common or dictionary meaning, but it should be interpreted as a meaning or concept conforming to the spirit of the present invention based on the principle that an inventor may suitably define the concept of term to illustrate his/her own invention in the best way.

In a method for preparing a CIS (Cu—In—Se) compound according to the present invention, a plurality of first composite particles having an indium selenide outer layer physically coupled to at least a part of copper selenide seed particle surfaces, or a plurality of second composite particles having a copper selenide outer layer physically coupled to at least a part of indium selenide seed particle surfaces are formed (S1).

At this time, as one preferable example, the composite particle may have a core-shell structure in which a copper selenide seed particle is coated with an indium selenide outer layer, or a core-shell structure in which an indium selenide seed particle is coated with a copper selenide outer layer.

Also, as another preferable example, the composite particle may have a dentrite structure in which indium selenide forming an outer layer is partially grown on a surface of a copper selenide seed particle, or a dentrite structure in which copper selenide forming an outer layer is partially grown on a surface of an indium selenide seed particle.

Accordingly, a diffusion distance required for reactants to form a CIS compound may be reduced, and at the same time reactivity among reactants may also be increased, so it is possible to prepare a CIS compound with improved dispersion, coupling and reaction uniformity among nanoparticle reactants.

The copper selenide seed particle and the indium selenide seed particle, used as a seed particle in the present invention, may be produced using a common way in the art, not specially limited.

The copper selenide seed particle may be produced using the following ways, for examples.

A $CuCl_2$ solution dissolved in tri-n-octylphosphine (TOP) is heated to 100° C., and tri-n-octylphosphine oxide (TOPO) is injected thereto. Then, tri-n-octylphosphine selenide (TOPSe) is added to and mixed with the reaction mixture and reacted at 250° C., and reactant is precipitated in methanol and then separated to produce a copper selenide particle (see H. Winkler, A. Birkner, V. Hagen, I. Wolf, F. Schmchel, H. V. Seggern, and R. A. Fischer, Advanced materials, 11 (17) 1444, 1999).

In addition, after copper chloride and selenous acid are added to a predetermined solution, ultrasonic vibration may be applied to the solution to induce chemical reaction, thereby making a copper selenide particle. This method is well disclosed in Korean Patent Application No. 2006-000752 filed by the applicant of this application, and incorporated herein as reference.

In addition, a copper selenide particle may be prepared by adding copper salt and selenous acid ($H_2SeO_3$) to a predetermined solvent and then by heating the mixture. This method is more economic since cheap organic solvents such as ethylene glycol or butanediol may be used as a solvent.

Also, the indium selenide particle may be produced using various ways as follows.

A solution obtained by injecting selenium and TOPO into TOP is mixed at 150° C. and heated to 250° C., and then TOP solution in which trimethyl indium is dissolved is injected to the reaction mixture, and then reacted, thereby producing an indium selenide particle (see S. Yang and D. F. Kelly, J. Phys. Chem. B, 109, 12701, 2005).

In addition, an indium selenide particle may be produced by adding indium salt and selenous acid ($H_2SeO_3$) to a predetermined organic solvent and then by heating the mixture. This method is well disclosed in Korean Patent Application No. 2006-036480 filed by the applicant of this application, and incorporated herein as reference.

A size of the seed particle is not specially limited, but preferably in the range of 10 nm to 10 μm in consideration of efficiency of reaction, more preferably 50 nm to 5 μm.

Outer layers of the first composite particles and the second composite particles are formed by adding seed particles into a precursor solution for outer layer and reacting them. Thus, the outer layer may also be formed by applying the methods for the preparation of seed particles explained above. That is to say, a formation reaction of the outer layer may be conducted by applying a method identical or similar to the above methods or based on the above methods, except that seed particles are added to the reaction system.

In one preferable example, a composite particle in which an indium selenide outer layer is coated on a surface of a copper selenide seed particle may be produced by adding a copper selenide seed particle into a precursor solution for the preparation of outer layer, obtained by dissolving indium nitrate and selenous acid into an organic solvent, and then by reacting them. At this time, the copper selenide seed particle may be preferably formed using one selected from the group consisting of CuSe, $Cu_2Se$ and their mixtures, but not limitedly.

In another preferable example, a composite particle in which a copper selenide outer layer is coated on a surface of an indium selenide seed particle may also be produced by adding an indium selenide particle into a precursor solution for the preparation of outer layer, obtained by dissolving copper nitrate and selenous acid into an organic solvent, and then by reacting them.

The organic solvent used in making the composite particle is preferably at least one selected from the group consisting of diethylene glycol, 1,4-butandiol, polyethylene glycol, propylene glycol, and polypropylene glycol.

The reaction for making the composite particle according to the present invention is preferably conducted at 100 to 250° C. for 30 minutes to 6 hours, more preferably at 150 to 200° C. for 2 to 4 hours, but not limitedly.

In the method for preparing a CIS compound according to the present invention, after composite particles are produced as mentioned above, composite particles selected from the group consisting of the made first composite particles, the made second composite particles, and their mixtures are thermally treated to prepare a CIS compound (S2).

This thermal treatment is conducted for reacting copper-indium-selenium composing the composite particles and obtaining a larger crystal size. Thus, any person having ordinary skill in the art it may easily conduct an optimal thermal treatment for sufficiently reacting copper-indium-selenium and growing crystals larger.

In addition, in a method for preparing a CIS compound thin film according to the present invention, a plurality of first composite particles having an indium selenide outer layer physically coupled to at least a part of a copper selenide seed particle surface or a plurality of second composite particles having a copper selenide outer layer physically coupled to at least a part of an indium selenide seed particle surface are firstly produced (S1).

In the method for preparing a CIS compound thin film according to the present invention, the composite particle-making step S1 may be conducted in the same way as in the composite particle-making process of the above-mentioned CIS compound preparing method.

The composite particles produced as mentioned above are made into a mixture paste shape and then coated on a substrate (S2).

The paste may be preferably made by mixing the composite particles together with ethyl cellulose, polypropylene carbonate or polypropylene glycol as binders in solvents such as water, alcohol or glycol.

The mixture paste may be made using a known method such as ball milling, and a solvent such as water or ethylene glycol monophenyl ether may be used in the ball milling. Dopant such as Na, K, Ni, P, As, Sb and Bi may be added in single or in mixture to the mixture paste, and this dopant may give effects such as improvement of electric properties of an absorption layer and increase of crystal size of the absorption layer.

The mixture paste made as mentioned above is coated on a substrate. The mixture paste is coated on the substrate using a known method such as doctor blade coating, spray coating, gravure printing and ink printing.

The coating layer may be configured in a single layer or multiple layers, and the entire thickness of the coating layer is preferably about in the range of 3 to 5 μm. This coating layer may be additionally dried at a low temperature of about 50 to 150° C. The multi-layered coating layer may be constructed by subsequently repeating this coating process.

After the coating layer is formed, the coating layer is thermally treated (S3).

At this time, the thermal treatment may adopt rapid thermal processing. Conventionally, the coating layer was formed using a mixture paste of metal oxide particles, so a reducing agent such as hydrogen should be used for reducing oxide particles in the thermal treatment. That is to say, a hydrogen reducing process was requested together with or before the thermal treatment. In addition, since selenium (Se) is not included in an initial reactant, a selenization process should be used after the thermal treatment. This selenization process was conducted by providing $H_2Se$, $(CH_3)_2Se$, $(C_2H_5)_2Se$ and so on in a heated state. Meanwhile, the present invention does not need such hydrogen reducing process and selenization process.

Furthermore, when using the conventional method as mentioned above, each metal exists on the coating layer mainly in a Cu—In alloy shape after thermal treatment, and it was not easy to obtain a $Cu(In,Ga)Se_2$ absorption layer suitable for a high-efficient solar cell with a large crystal size by selenization. Meanwhile, in the present invention, since Cu—In—Se is reacted during the thermal treatment process, properties of a copper selenide compound existing in a liquid state at a relatively low temperature may be used, so it is possible to make an absorption layer with a greater crystal size.

Among various heating methods, the rapid thermal processing is used since it is most suitable for getting a temperature sufficient for reaction of the coating layer and crystal growth together with minimizing a thermal load applied to the substrate. Thus, if a thermal treatment temperature is too low or a processing time is too short, the coating layer is non-reacted or a crystal size is decreased. On the contrary, if the thermal treatment temperature is too high or the processing time is too long, the substrate may be transformed undesirably. In the present invention, the rapid thermal processing may be conducted at 400 to 600° C. for 1 to 30 minutes.

The preparing method of the present invention may further include other processes if they do not damage the effects of the present invention, and it should be understood to be included in the scope of the present invention.

In addition, the CIS thin film prepared by the method of the present invention may be used as an absorption layer of a solar cell in which a substrate, a conductive layer, an absorption layer, a buffer layer and a transparent window layer are subsequently laminated.

The CIS compound prepared according to the present invention has a crystal size in the range of 0.5 to 1.5 μm, which is greatly increased in comparison to the conventional art. A solar cell having an absorption layer with such a great crystal size shows an excellent efficiency.

FIG. 1 is a schematic sectional view exemplarily showing a solar cell composed of several layers, used in the art. However, an absorption layer of a solar cell using the CIS compound thin film of the present invention is not limited thereto.

Referring to FIG. 1, a solar cell 10 may be configured such that a substrate 11, a conductive layer 12, a p-type absorption layer 13, a n-type buffer layer 14 and a n-type transparent window layer 15 are subsequently arranged. Here, the conductive layer 12 may be made of common metal such as molybdenum (Mo), tungsten (W), tantalum (Ta), titanium (Ti) and gold (Au), in which molybdenum is most preferred. The substrate 11 may be made of glass, alumina, polyimide, or conductive material such as molybdenum, tungsten, tantalum, titanium, aluminum, nickel or graphite. In case a conductive material is used for the substrate 11, the conductive layer 12 may be excluded to configure the substrate in one layer.

In addition, finger patterns 16 may be coated as shown in FIG. 1, but not necessarily. These finger patterns 16 are applied as required for reducing resistance induced by the transparent window layer 15, thereby enhancing efficiency of the solar cell.

Hereinafter, the preferred embodiment of the present invention will be described in detail based on examples. However, the embodiments of the present invention may be modified in various ways, and the scope of the present invention should not be interpreted as being limited to the examples. The embodiments of the present invention are provided just for explaining the present invention more perfectly to those having ordinary skill in the art.

Example 1

Figure 2:
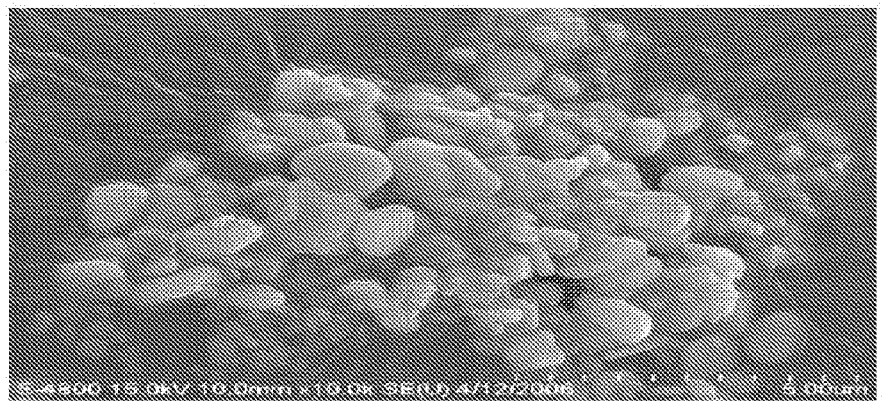
FIGS. 2 and 3 are SEM (Scanning Electronic Microscope) photographs showing composite particles before RTP (Rapid Thermal Processing) produced according to a first embodiment of the present invention.
Figure 3:
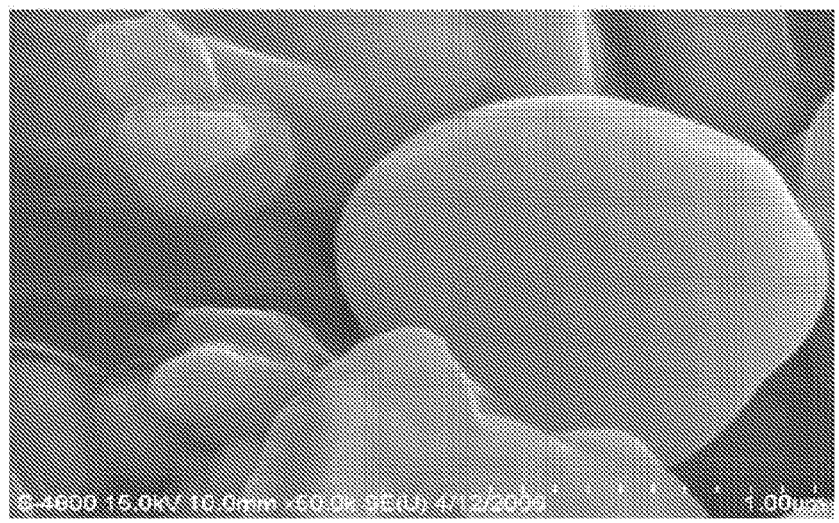

2 g of In—Se particles were mixed as seed particles in 250 ml of a diethylene glycol solvent together with 2 g of copper nitrate and 2 g of selenous acid as reactant precursors. The reaction solution was heated to 170° C. and reacted for about 3 hours to produce composite particles. SEM (Scanning Electronic Microscope) photographs for the composite particles are respectively shown in FIGS. 2 and 3 (FIG. 2: 10,000 magnifications, FIG. 3: 50,000 magnifications). The photographs of FIGS. 2 and 3 are respectively obtained at an acceleration voltage of 15 keV using a JSM-6340F electronic microscope manufactured by JEOL. As shown in these photographs, it would be found that the composite particle is obtained in a core-cell structure where copper selenide is coated on an indium selenide particle.

Figure 4:
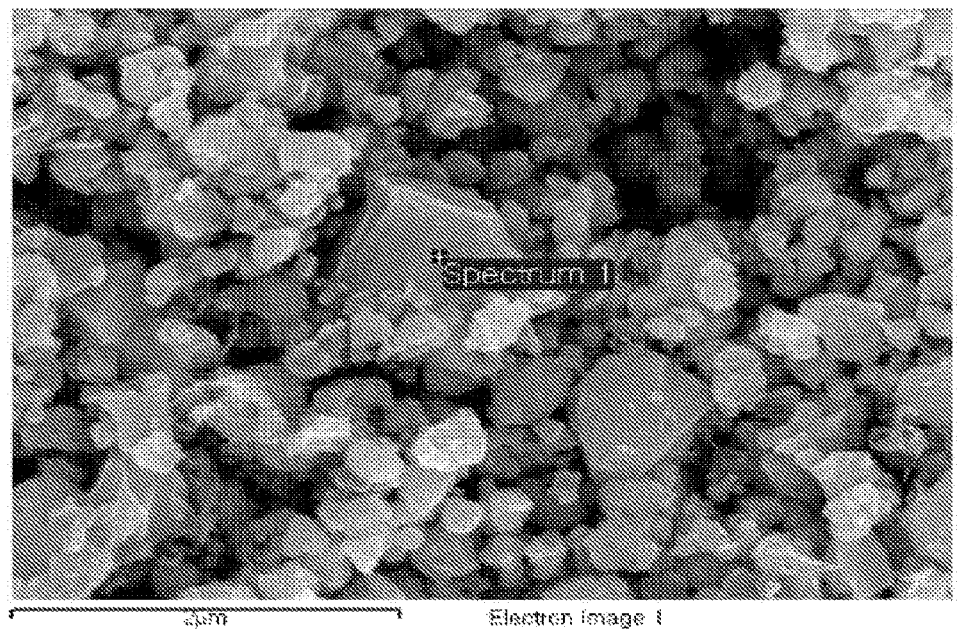
FIGS. 4 and 5 are SEM photographs showing CIS (Cu—In—Se) compound crystals after RTP prepared according to the first embodiment of the present invention.
Figure 5:
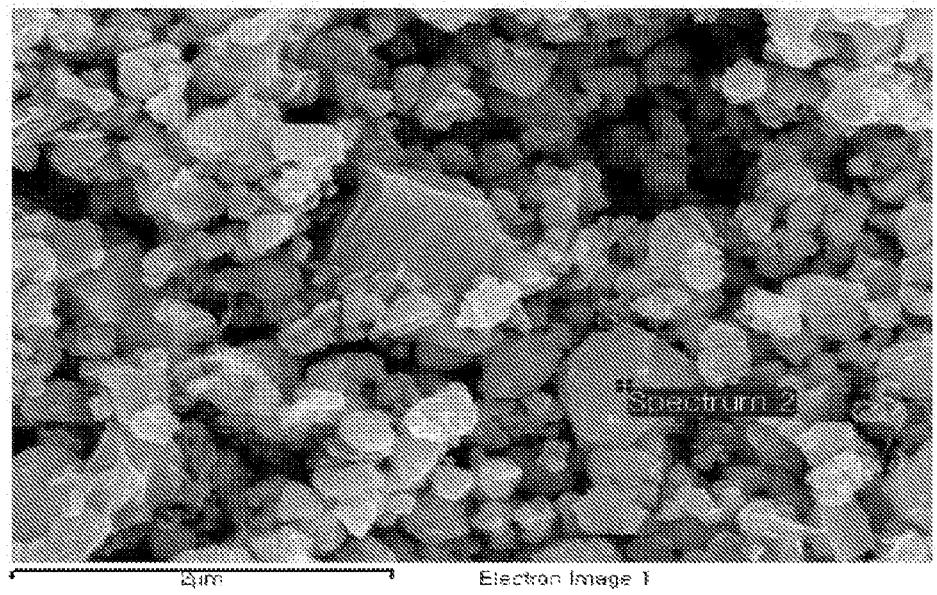

Powder of the product mixture was mixed with terpineol as a solvent and polypropylene carbonate as a binder, and then made into paste. The paste was coated on a substrate, and then RTA (Rapid Thermal Annealing) was conducted at 480° C. for 5 minutes in $N_2$ atmosphere to make $CuInSe_2$ (CIS). SEM photographs for the CIS crystal made as mentioned above are respectively shown in FIGS. 4 and 5. As seen from the photographs, it would be found that the crystal finally obtained is changed from a rounded core-shell structure of FIGS. 2 and 3 into somewhat angled particles.

Figure 6:
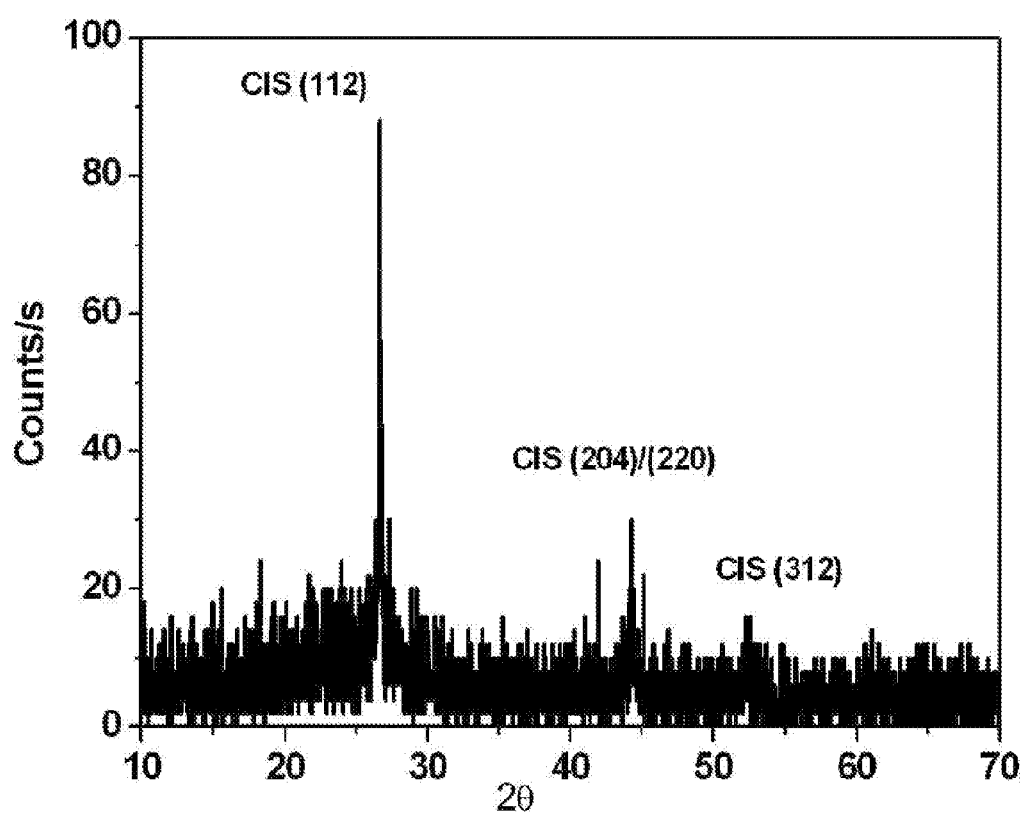
FIG. 6 is a XRD (X-ray Diffraction) graph for the CIS compound prepared according to the first embodiment of the present invention.

The local compositions of CIS grains with relatively large grain size were analyzed using EDS (Energy Dispersive Spectroscopy) analysis, which uses the specific transition energy related to each element. The analysis results are shown in the following table 1 (composition at a spectrum 1 position of FIG. 4) and the following table 2 (composition at a spectrum 2 position of FIG. 5). Also, in order to check the phase of the product, XRD (X-ray Diffraction) analysis was conducted using D4 endeavor diffractometer manufactured by Bruker. The results are shown in FIG. 6.

TABLE 1

| Element | Weight % | Atomic % |
|---------|----------|----------|
| Cu K    | 18.42    | 24.32    |
| Se L    | 48.45    | 51.48    |
| In L    | 33.12    | 24.20    |
| Totals  | 100.00   |          |

TABLE 2

| Element | Weight % | Atomic % |
|---------|----------|----------|
| Cu K    | 16.43    | 21.84    |
| Se L    | 49.89    | 53.37    |
| In L    | 33.68    | 24.78    |
| Totals  | 100.00   |          |

* K and L following each element designate a transition energy of K, L electron shell of each element.

It would be found that $CuInSe_2$ is composed, as seen from the EDS analysis results of Tables 1 and 2 and the XRD analysis results of FIG. 6.

Example 2

The experiment identical to the embodiment 1 was repeated, except that 2 g of CuSe particles were mixed as seed particles in 250 ml of a 1,4 butanediol solvent together with 3 g of indium nitrate and 0.06 M of selenous acid as reactant precursors, and the reaction solution was heated to 150° C. and reacted for about 3 hours to produce composite particles.

Figure 7:
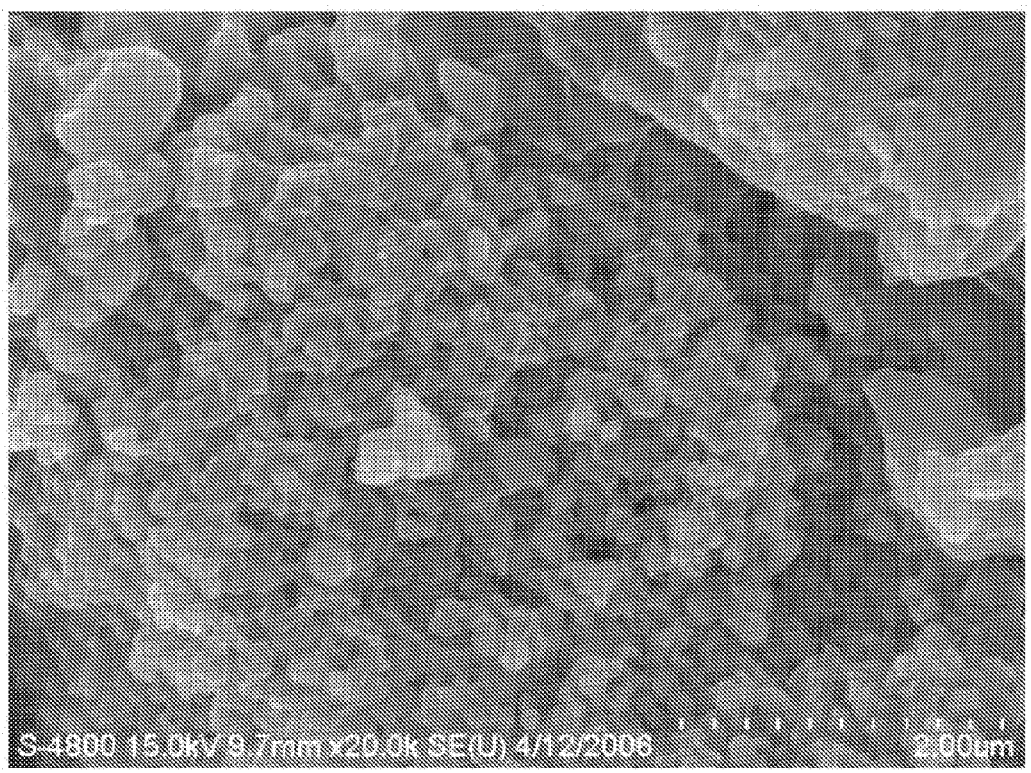
FIGS. 7 and 8 are SEM photographs showing composite particles before RTP produced according to a second embodiment of the present invention.
Figure 8:
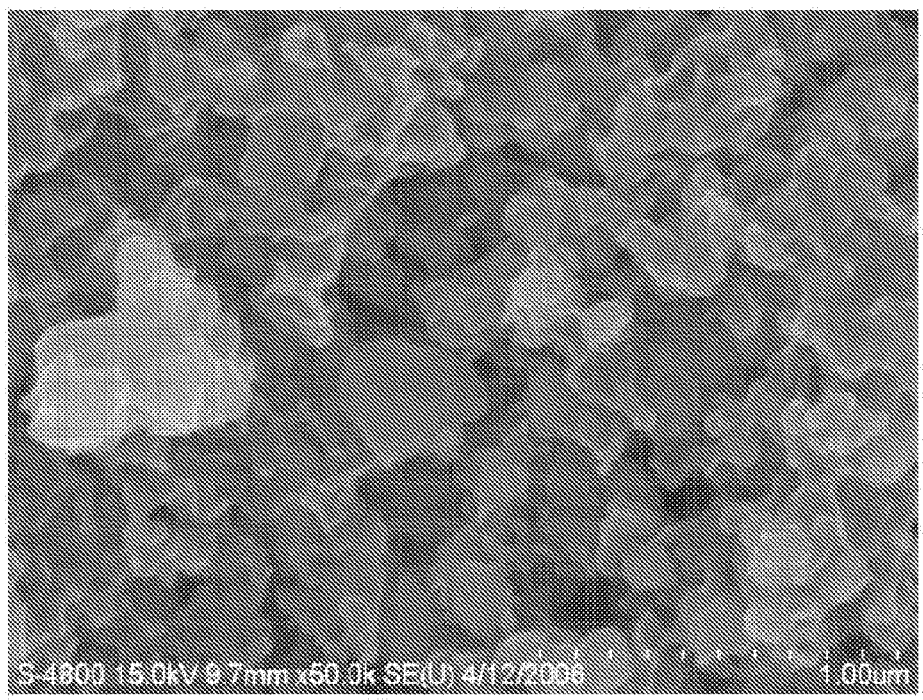

SEM photographs for the generated composite particles are respectively shown in FIGS. 7 and 8 (FIG. 7: 20,000 magnifications, FIG. 8: 50,000 magnifications). As shown in these photographs, it would be found that the composite particle is obtained in an irregular shape where indium selenide is coated on a copper selenide particle.

Figure 9:
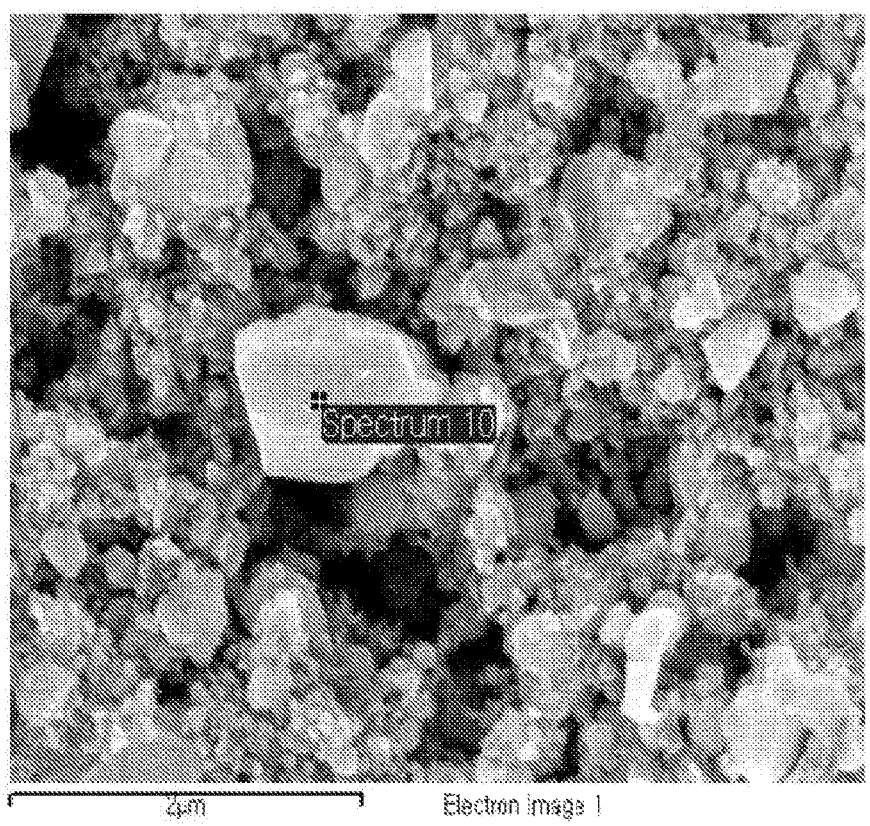
FIGS. 9 and 10 are SEM photographs showing CIS compound crystals after RTP prepared according to the second embodiment of the present invention.
Figure 10:
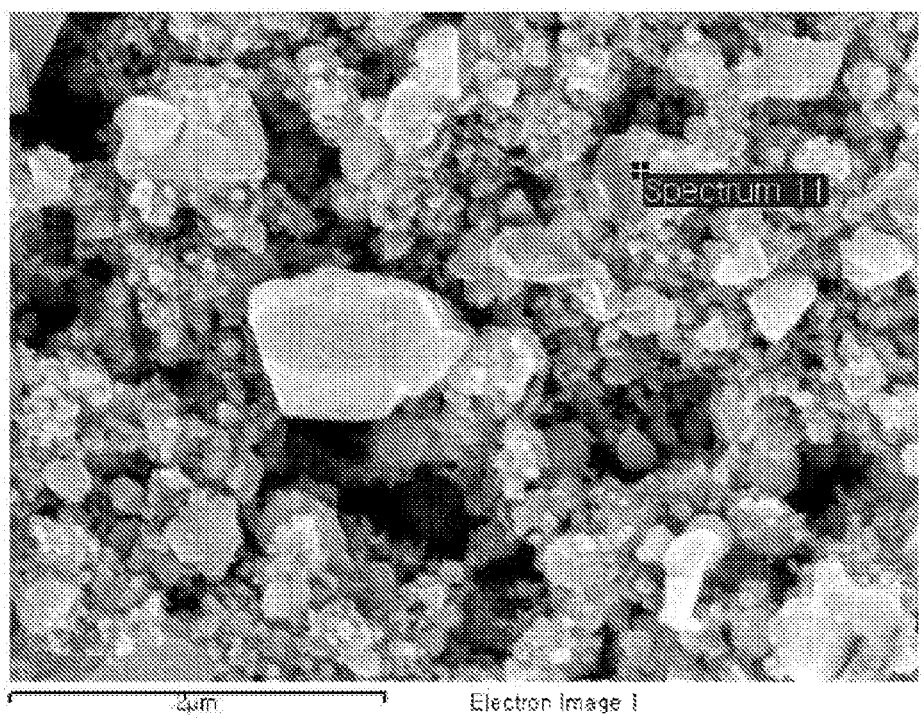

In addition, SEM photographs for the CIS crystal after RTA are respectively shown in FIGS. 9 and 10. As seen from the photographs, it would be found that the crystal finally obtained changes its shape to some level during RTA in comparison to the composite particle of FIGS. 7 and 8.

Figure 11:
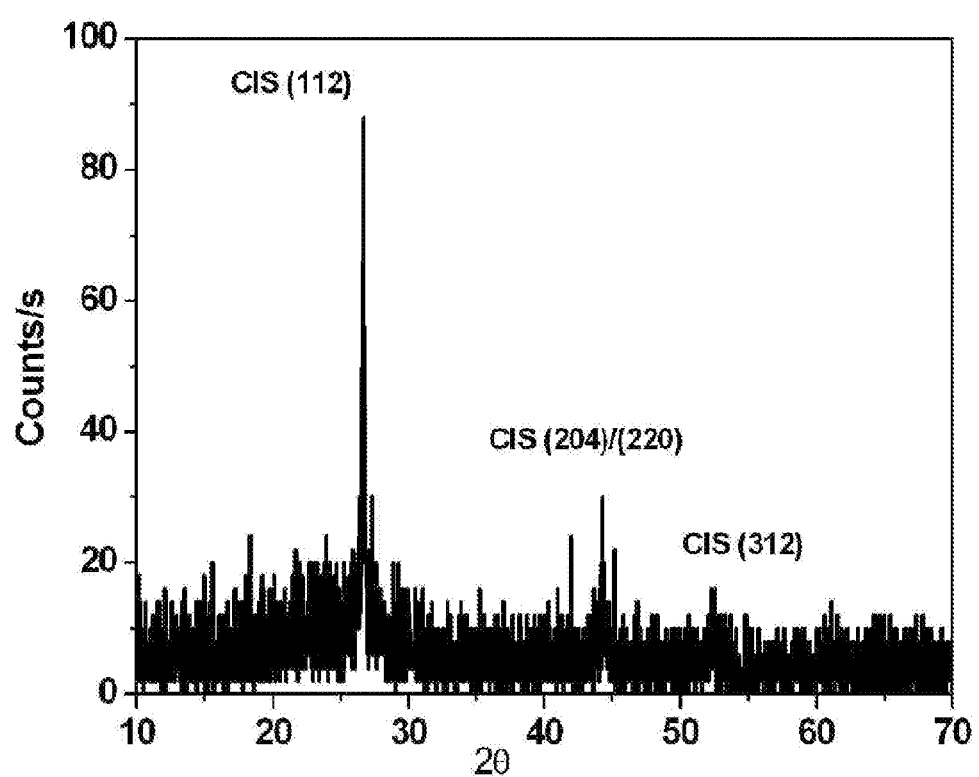
FIG. 11 is a XRD graph for the CIS compound prepared according to the second embodiment of the present invention.

In addition, the local composition of CIS grains with relatively large grain size was analyzed using EDS. The analysis results are shown in the following table 3 (composition at a spectrum 10 position of FIG. 9) and the following table 4 (composition at a spectrum 11 position of FIG. 10). Also, XRD analysis results for checking the phase of a composed material are shown in FIG. 11.

TABLE 3

| Element | Weight % | Atomic % |
|---------|----------|----------|
| Cu K    | 15.02    | 20.08    |
| Se L    | 50.78    | 54.62    |
| In L    | 34.20    | 25.30    |
| Totals  | 100.00   |          |

TABLE 4

| Element | Weight % | Atomic % |
|---------|----------|----------|
| Cu K    | 19.89    | 25.79    |
| Se L    | 51.34    | 53.57    |
| In L    | 28.77    | 20.64    |
| Totals  | 100.00   |          |

It would be found that $CuInSe_2$ is formed, as seen from the EDS analysis results of Tables 3 and 4 and the XRD analysis results of FIG. 11.

In the above, the present invention has been illustrated in detail using specific examples, but it would be possible to make various applications and modifications within the scope of the present invention based on the above by those having ordinary skill in the art.

APPLICABILITY TO THE INDUSTRY

As explained above, the method for preparing a solar cell absorption layer according to the present invention prevents loss of selenium, which inevitably required selenium environment, in comparison to the conventional method. Also, since a CIS compound made using CIS precursors with improved dispersion, coupling and reaction uniformity of reactants is used in the present invention, it is expected to make a highly efficient absorption layer, resulting in enhanced efficiency of a final solar cell product and increased competitiveness of the product. Also, the method of the present invention may be widely applied to solar cells and other electronic devices.

What is claimed is:

1. A method for preparing a CIS (Cu—In—Se) compound, comprising:
    (S1) producing at least one of a plurality of first composite particles having an indium selenide outer layer physically coupled to at least a part of a copper selenide seed particle surface and a plurality of second composite particles having a copper selenide outer layer physically coupled to at least a part of an indium selenide seed particle surface; and
    (S2) making the CIS compound by thermally treating composite particles selected from the group consisting of the first composite particles, the second composite particles and their mixtures,
    wherein in the (S1) step, the plurality of the first composite particles and the plurality of the second composite particles are produced by using the indium selenide and the copper selenide as reactants, the indium selenide and the copper selenide exist together in one particle shape, and the reaction for making the first composite particles and the second composite particles is conducted at 150 to 250° C.,
    wherein the (S2) step is conducted at 400 to 600° C., and the CIS compound has a crystal size in a range of 0.5 to 1.5 μm,
    wherein each outer layer of the first composite particles and the second composite particles is formed by adding each seed particle into a precursor solution for the outer layer where the seed particle reacts with the precursor solution,
    wherein the seed particle for the first composite particles is copper selenide seed and the precursor solution for the outer layer is a mixture of indium nitrate, selenous acid, and an organic solvent, and
    wherein the seed particle for second composite particles is indium selenide and the precursor solution for the outer layer is a mixture of copper nitrate, selenous acid, and an organic solvent.

2. The method for preparing a CIS compound according to claim 1,
    wherein the first composite particles and the second composite particles have a core-shell structure in which each seed particle is coated with the outer layer, respectively.

3. The method for preparing a CIS compound according to claim 1,
    wherein the first composite particles have a dentrite structure in which indium selenide is partially grown on a surface of the copper selenide seed particle, and the second composite particles have a dentrite structure in which copper selenide is partially grown on a surface of the indium selenide seed particle.

4. The method for preparing a CIS compound according to claim 1,
    wherein the copper selenide seed particles are formed using at least one selected from the group consisting of CuSe, $Cu_2Se$, and their mixtures.

5. The method for preparing a CIS compound according to claim 1,
    wherein the organic solvent is at least one or a mixture of at least two selected from the group consisting of diethylene glycol, 1,4-butanediol, polyethylene glycol, propylene glycol, and polypropylene glycol.

6. A method for preparing a CIS (Cu—In—Se) compound thin film, comprising:
    (S1) producing at least one of a plurality of first composite particles having an indium selenide outer layer physically coupled to at least a part of a copper selenide seed particle surface and a plurality of second composite particles having a copper selenide outer layer physically coupled to at least a part of an indium selenide seed particle surface;
    (S2) coating a paste including the composite particles on a substrate; and
    (S3) forming a thin film composed of the CIS compound by thermally treating the resultant material of the step (S2),
    wherein in the (S1) step, the plurality of the first composite particles and the plurality of the second composite particles are produced by using the indium selenide and the copper selenide as reactants, the indium selenide and the copper selenide exist together in one particle shape, and the reaction for making the first composite particles and the second composite particles is conducted at 150 to 250° C.,
    wherein the (S3) step adopts a rapid thermal processing, and the rapid thermal processing is conducted at 400 to 600° C., and the CIS compound has a crystal size in a range of 0.5 to 1.5 μm,
    wherein each outer layer of the first composite particles and the second composite particles is formed by adding each seed particle into a precursor solution for the outer layer where the seed particle reacts with the precursor solution,
    wherein the seed particle for the first composite particles is copper selenide seed and the precursor solution for the outer layer is a mixture of indium nitrate, selenous acid, and an organic solvent, and
    wherein the seed particle for second composite particles is indium selenide and the precursor solution for the outer layer is a mixture of copper nitrate, selenous acid, and an organic solvent.

7. The method for preparing a CIS compound thin film according to claim 6, wherein the copper selenide seed particles are formed using at least one selected from the group consisting of CuSe, $Cu_2Se$, and their mixtures.

8. The method for preparing a CIS compound thin film according to claim 6,
    wherein the paste is made by mixing the first or second composite particles with ethyl cellulose, polypropylene carbonate or polypropylene glycol acting as binders in a solvent selected from water, alcohol and glycol.

9. A solar cell in which a substrate, a conductive layer, an absorption layer, a buffer layer and a transparent window layer are subsequently formed,
    wherein the absorption layer is the CIS compound thin film prepared according to the method defined in claim 6.

* * * * *